United States Patent
Imaizumi et al.

(10) Patent No.: US 9,857,685 B2
(45) Date of Patent: Jan. 2, 2018

(54) PHOTOSENSITIVE RESIN COMPOSITION, RESIST LAMINATE, CURED PRODUCT OF PHOTOSENSITIVE RESIN COMPOSITION, AND CURED PRODUCT OF RESIST LAMINATE (11)

(71) Applicant: Nippon Kayaku Kabushiki Kaisha, Tokyo (JP)

(72) Inventors: Naoko Imaizumi, Tokyo (JP); Yoshiyuki Ono, Tokyo (JP); Takanori Koizumi, Tokyo (JP); Maki Kumagai, Tokyo (JP); Shinya Inagaki, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/317,666

(22) PCT Filed: Jun. 9, 2015

(86) PCT No.: PCT/JP2015/066592
§ 371 (c)(1),
(2) Date: Dec. 9, 2016

(87) PCT Pub. No.: WO2015/190476
PCT Pub. Date: Dec. 17, 2015

(65) Prior Publication Data
US 2017/0102614 A1    Apr. 13, 2017

(30) Foreign Application Priority Data
Jun. 13, 2014 (JP) ................................. 2014-122335

(51) Int. Cl.
*G03F 7/075* (2006.01)
*G03F 7/038* (2006.01)
*G03F 7/004* (2006.01)

(52) U.S. Cl.
CPC .......... *G03F 7/0758* (2013.01); *G03F 7/0045* (2013.01); *G03F 7/038* (2013.01); *G03F 7/0382* (2013.01); *G03F 7/0751* (2013.01)

(58) Field of Classification Search
CPC ................................ G03F 7/0382; G03F 7/38
See application file for complete search history.

(56) References Cited

U.S. PATENT DOCUMENTS

| | | | |
|---|---|---|---|
| 4,882,245 A | 11/1989 | Gelorme et al. | |
| 2003/0035903 A1* | 2/2003 | Yeh .......................... | C08L 63/00 427/558 |
| 2008/0032154 A1 | 2/2008 | Akatsuka et al. | |
| 2010/0270060 A1 | 10/2010 | Mizutani et al. | |
| 2010/0289600 A1 | 11/2010 | Takada et al. | |
| 2013/0200298 A1* | 8/2013 | Izutani ..................... | C09K 5/14 252/74 |
| 2015/0301450 A1 | 10/2015 | Imaizumi et al. | |
| 2015/0309409 A1* | 10/2015 | Imaizumi ............... | C08G 59/24 430/280.1 |

FOREIGN PATENT DOCUMENTS

| | | |
|---|---|---|
| JP | 2002-302536 A | 10/2002 |
| JP | 2005-247902 A | 9/2005 |
| JP | 2006-2020 A | 1/2006 |
| JP | 2008-26667 A | 2/2008 |
| JP | 2010-256718 A | 11/2010 |
| JP | 2010-276694 A | 12/2010 |
| JP | 2012-241029 A | 12/2012 |
| WO | 2006/008984 A1 | 1/2006 |
| WO | 2007/032326 A1 | 3/2007 |
| WO | 2009/104438 A1 | 8/2009 |
| WO | 2014/065394 A1 | 5/2014 |
| WO | 2014/080976 A1 | 5/2014 |

OTHER PUBLICATIONS

JER Epoxy Resin Catalogue,Rev. Oct. 1, 2016 from the Kaiteki Company , Mitsubishi Chemical revised Oct. 1, 2016, eleven pages unumbered obtained from world wide web.*
Labianca et al., "High Aspect Ratio Resist for Thick Film Applications," Proc. SPIE, vol. 2438, pp. 846-852, 1995.
European communication dated Oct. 24, 2017 in corresponding European patent application No. 15806943.5.

* cited by examiner

*Primary Examiner* — Cynthia Hamilton
(74) *Attorney, Agent, or Firm* — Nields, Lemack & Frame, LLC

(57) ABSTRACT

The purpose of the present invention is to provide: a resin composition, a cured product of which has extremely low residual stress and exhibits excellent adhesion to a metal substrate such as a Pt, LT or Ta substrate after a wet heat test in the fields of semiconductors and MEMS/micromachine applications; a laminate of this resin composition; and a cured product of this resin composition or the laminate. The present invention is a photosensitive resin composition which contains an epoxy resin (A), a compound having a phenolic hydroxyl group (B) and a cationic photopolymerization initiator (C), and wherein: the epoxy resin (A) has a weighted average epoxy equivalent weight of 300 g/eq. or more; 20% by mass or more of the epoxy resin (A) is an epoxy resin represented by formula (1) and having an epoxy equivalent weight of 500-4,500 g/eq.; and the compound having a phenolic hydroxyl group (B) contains a phenolic compound having a specific structure.

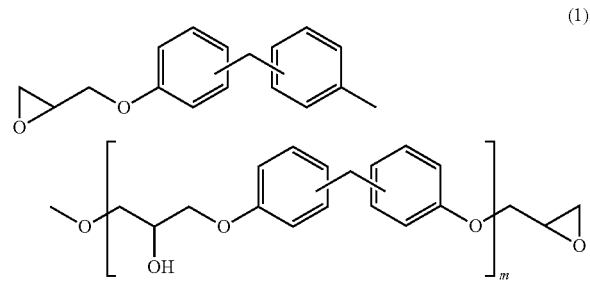

16 Claims, No Drawings

PHOTOSENSITIVE RESIN COMPOSITION, RESIST LAMINATE, CURED PRODUCT OF PHOTOSENSITIVE RESIN COMPOSITION, AND CURED PRODUCT OF RESIST LAMINATE (11)

TECHNICAL FIELD

The present invention relates to a photosensitive resin composition and a cured product thereof. More specifically, the present invention relates to a photosensitive resin composition which enables an image having a good sidewall profile and excellent resolution to be formed, whose cured product exhibits a low residual stress and prevents the warping of a substrate, and which is excellent in the tight adhesion to a substrate after a test for moisture and heat, and a cured product of the photosensitive resin composition. The photosensitive resin composition and the cured product thereof according to the present invention having such excellent properties are useful in fabrication of MEMS (microelectromechanical system) components, μ-TAS (micro total analysis system) components, microreactor components, insulating layers of electronic components such as capacitors and inductors, LIGA components, dies and stamps for micro injection molding and heat embossing, screens or stencils for fine printing applications, package components for MEMS sensors, semiconductor devices and frequency devices, bio-MEMS and biophotonic devices, inkjet printing head components, and printed wiring boards.

BACKGROUND ART

Among photosensitive resin compositions, photolithographically processable ones are called photoresists and broadly used for semiconductors, MEMS and micromachine applications, and the like. In such applications, the photolithographic processing is accomplished by carrying out patterning exposure on a substrate and then selectively removing exposed regions or non-exposed regions by subsequent development with a developing solution. The photoresists are classified into positive and negative types. Exposed portions are dissolved in a developing solution in the positive type, while exposed portions become insoluble in the negative type. In electropackage applications and MEMS applications of advanced technologies, not only the capacity of forming uniform spin coating films but also a high aspect ratio, a vertical side wall shape in thick films, and high tight adhesion with substrates and the like are demanded. Here, the aspect ratio is an important property which is calculated using the ratio of a resist film thickness/a pattern line width and indicates the photolithographic performance.

Compositions having a bisphenol A novolac epoxy resin as a major component disclosed in Patent Literature 1 and Non Patent Literature 1 have a very high resolution and the use of the compositions enables formation of higher-aspect ratio photosensitized images and photosensitive resin cured products. However, the resin cured products obtained using the compositions pose such problems that substrates are largely warped after photolithographic processing using silicon wafers or the like as the substrates thereby damaging fabricated devices and decreasing the yields due to their remarkably high residual stress values. Further, due to the high residual stress, cracks (crazings) are generated at the time of development in some cases and exfoliation is easily generated between the substrates and the resin cured products in some cases.

Patent Literature 2 discloses that a resin composition containing a bisphenol epoxy resin, an alicyclic epoxy resin and a cationic photopolymerization initiator is excellent in the adhesiveness with a Ni/Si wafer. Patent Literature 3 discloses that a photosensitive resin composition containing an epoxy resin having a specific epoxy equivalent and a specific softening point, a phenolic curing agent having a specific hydroxyl equivalent, and a photoacid generator is excellent in the adhesiveness with a silicon wafer. Further, Patent Literature 4 discloses that a photosensitive resin composition containing a bisphenol epoxy resin, a phenol novolac epoxy resin having a specific structure, and a cationic photopolymerization initiator is excellent in the adhesiveness with a silicon wafer. As a result of studies by the present inventors, however, it has been found that the resin compositions in these Patent Literatures were insufficient in the adhesiveness with metals (substrates) such as Pt and Ta after a test for moisture and heat. Further, the residual stress of the cured products was very high and warping of the substrates was remarkable.

On the other hand, in recent years, in MEMS applications utilizing photolithographic processing, development has been conducted for manufacture of frequency filter elements such as surface acoustic wave filters mounted on communication terminals. As a typical one, Patent Literature 5 discloses a technique in which a frequency filter element can be manufactured in a small size and at a low cost by forming an interdigitated electrode in which a plurality of metal films are layered on a piezoelectric substrate of lithium tantalate (LT) or the like and using an organic resin photolithographically processable as an insulating film on the electrode. However, there have been such defects that since the polyimide necessitates a high-temperature curing condition, it causes damage to devices; and the epoxy resin can be cured at a low temperature, but to due to a high residual stress of the cured product, the warping of the substrate, the cracks of the film, and the degradation in the tight adhesion on the Pt film and the LT substrate after the moisture and heat treatment tend to occur.

CITATION LIST

Patent Literature

Patent Literature 1: U.S. Pat. No. 4,882,245
Patent Literature 2: JP 2002-302536 A
Patent Literature 3: JP 2008-26667 A
Patent Literature 4: JP 2010-276694 A
Patent Literature 5: WO2009/104438

Non Patent Literature

Non Patent Literature 1: N. LaBianca and J. D. Gelorme, "High Aspect Ratio Resist for Thick Film Applications", Proc. SPIE, vol. 2438, p. 846(1995)

SUMMARY OF INVENTION

Technical Problem

The present invention has been achieved in consideration of the above-mentioned situation and has an object to provide a resin composition which is an epoxy resin composition to be cured by cationic photopolymerization and which is very low in the residual stress of its cured product and excellent in the tight adhesion with a metal substrate of Pt, LT, Ta or the like after a test for moisture and heat, and/or a laminate of the resin composition, and a cured product of the resin composition, in the fields of semiconductors, and MEMS and micromachine applications.

Solution to Problem

As a result of exhaustive studies, the present inventors have found that the above problem can be solved by using a photosensitive resin composition comprising an epoxy resin having a specific structure, a compound having a specific structure and a phenolic hydroxyl group, and a cationic photopolymerization initiator.

That is, various aspects of the present invention are as follows.

[1]. A photosensitive resin composition comprising: an epoxy resin (A); a compound having phenolic hydroxyl groups (B); and a cationic photopolymerization initiator (C), wherein the epoxy resin (A) has a weighted average epoxy equivalent of 300 g/eq. or higher, and the epoxy resin (A) comprises 20% by mass or more of an epoxy resin represented by the following formula (1):

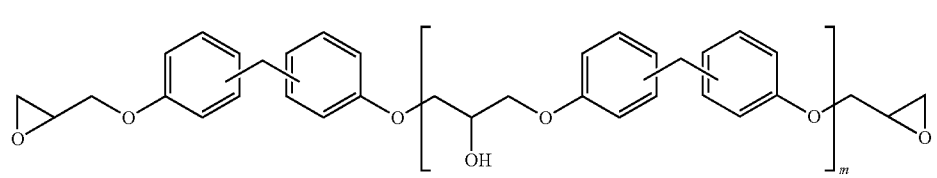
(1)

wherein m is an average value and denotes a real number in the range of 3 to 35; and having an epoxy equivalent of 500 to 4,500 g/eq.; and the compound having phenolic hydroxyl groups (B) comprises at least one or more phenol compounds selected from the group consisting of phenol compounds represented by the formulae (2), (4), (5) and (6):

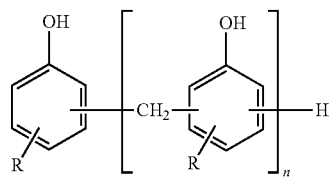
(2)

wherein n is an average value and denotes a real number in the range of 1 to 10; and each R independently denotes a hydrogen atom or an alkyl group having 1 to 4 carbon atoms,

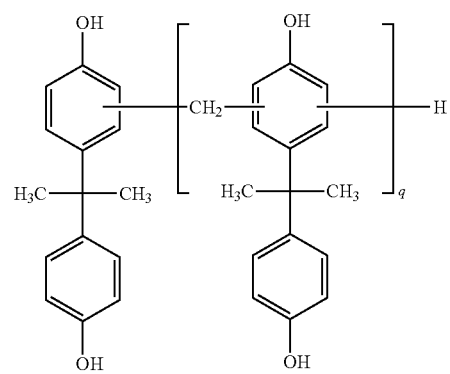
(4)

wherein q is an average value and denotes a real number in the range of 1 to 10,

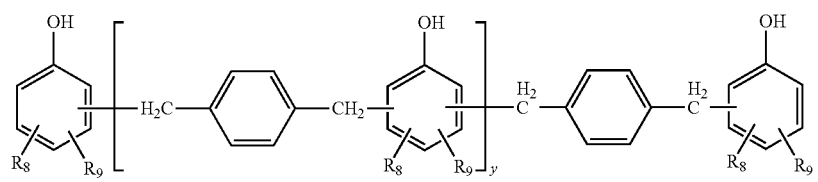
(5)

wherein z is an average value and denotes a real number in the range of 1 to 10, and

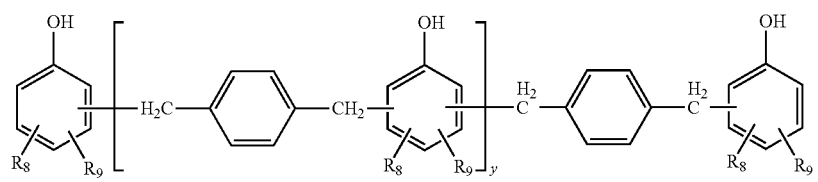
(6)

wherein y is an average value and denotes a real number in the range of 1 to 10; and $R_8$ and $R_9$ each independently denote a hydrogen atom or an alkyl group having 1 to 4 carbon atoms.

[2]. The photosensitive resin composition according to the above [1], wherein the epoxy resin (A) comprises an epoxy resin represented by the following formula (3):

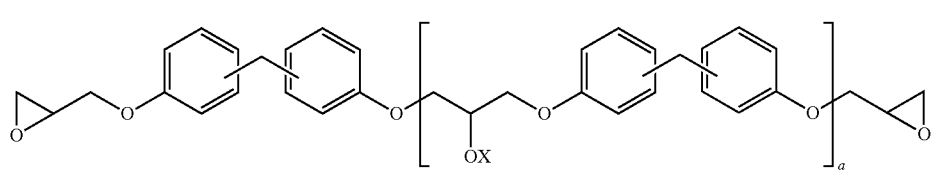
(3)

wherein a is an average value and denotes a real number in the range of 2 to 30; and each X independently denotes a hydrogen atom or a glycidyl group and at least one of the plurality of X is a glycidyl group.

[3]. The photosensitive resin composition according to the above [1] or [2], comprising 0.1 to 0.9 equivalents of the compound having phenolic hydroxyl groups (B) with respect to 1 equivalent of the epoxy resin (A).

[4]. The photosensitive resin composition according to any one of the above [1] to [3], wherein the cationic photopolymerization initiator (C) is a cationic photopolymerization initiator of an onium complex salt.

[5]. The photosensitive resin composition according to any one of the above [1] to [4], comprising an epoxy group-containing silane compound (D).

[6]. The photosensitive resin composition according to any one of the above [1] to [5], comprising a solvent (E).

[7]. A cured product of the photosensitive resin composition according to any one of the above [1] to [6].

[8]. A resist laminate obtained by interposing the photosensitive resin composition according to any one of the above [1] to [6] between substrates.

[9]. A cured product of a dry film resist obtained from the resist laminate according to the above [8].

Advantageous Effects of Invention

The photosensitive resin composition according to the present invention allows formation of a pattern having a fine and vertical side wall shape by photolithography. Its cured product has properties high in the resolution, high in the sensitivity, and excellent in the tight adhesion with a metal substrate of Pt, LT, Ta or the like after a test for moisture and heat. Hence, by using the photosensitive resin composition according to the present invention, a permanent resist and a cured product can be provided with properties required in the fields of semiconductors and MEMS and micromachine applications, particularly package components for MEMS devices, semiconductor devices and frequency filter devices, components for forming microreactors, and inkjet printing head components.

DESCRIPTION OF EMBODIMENTS

Hereinafter, the present invention will be described.

The photosensitive resin composition according to the present invention comprises an epoxy resin (A) having a weighted average epoxy equivalent of 300 g/eq. or higher. The term weighted average epoxy equivalent referred to herein means a weighted average epoxy equivalent of all epoxy resins contained in the epoxy resin (A); for example, the weighted average epoxy equivalent in the case of containing 2 mol of an epoxy resin having an epoxy equivalent of 100 g/eq. and 1 mol of an epoxy resin having an epoxy equivalent of 400 g/eq. is estimated to be (100×2 mol+400×1 mol)/(2 mol+1 mol)=200 g/eq. Here, the epoxy equivalent in the present invention means a measurement value acquired according to JIS K7236. The weighted average epoxy equivalent is more preferably 400 g/eq. or higher.

The epoxy resin (A) contained in the photosensitive resin composition according to the present invention comprises a bifunctional epoxy resin commonly referred to as a bisphenol F epoxy resin (compound) and represented by the above formula (1).

In the formula (1), m is an average value and denotes a real number in the range of 3 to 35. The "average value" referred to herein means an average repeating number. For example, the average value m of an epoxy resin containing 1 mol of the compound with the structure having m of 2 in the formula (1), 2 mol of the compound with the structure having m of 3 therein, 3 mol of the compound with the structure having m of 4 therein, and 1 mol of the compound with the structure having m of 5 therein is estimated to be (2×1 mol+3×2 mol+4×3 mol+5×1 mol)/(1 mol+2 mol+3 mol+1 mol)≈3.57. Similarly, the average value m of an epoxy resin containing 2 mol of the compound with the structure having m of 0, 3 mol of the compound with the structure having m of 5, 3 mol of the compound with the structure having m of 6, 3 mol of the compound with the structure having m of 7, and 1 mol of the compound with the structure having m of 32 is estimated to be (0×2 mol+5×3 mol+6×3 mol+7×3 mol+32×1 mol)/(2 mol+3 mol+3 mol+1 mol)≈7.17. That is, in the epoxy resin represented by the formula (1) contained in the photosensitive resin composition according to the present invention, a compound in which m in the formula (1) is 0 or more and less than 3 and/or an epoxy resin (or an epoxy compound) in which m in the formula (1) is more than 35 may be used concurrently, as long as the average value m is in the range of 3 to 35.

The epoxy equivalent of the epoxy resin represented by the formula (1) is usually 500 to 4,500 g/eq. The epoxy equivalent is more preferably 700 to 3,000 g/eq from the viewpoint of the sensitivity and the developability of the photosensitive resin composition and the strength and the durability of the cured product. The average value m of the epoxy resins represented by the formula (1) having such preferable epoxy equivalents is 4 to 22.

Examples of commercially available products of bisphenol F epoxy resins having an average value m of 3 to 35 include jER4004P (m in the formula (1) is about 5.3 to 6.4, epoxy equivalent: 840 to 975 g/eq.), jER4005P (m in the formula (1) is about 6.2 to 8.2, epoxy equivalent: 950 to 1,200 g/eq.), jER4007P (m in the formula (1) is about 14.4 to 18.3, epoxy equivalent: 2,000 to 2,500 g/eq.) and jER4010P (m in the formula (1) is about 28.5 to 34.7, epoxy equivalent: 3,800 to 4,600 g/eq.), which are commercially available from Mitsubishi Chemical Corp.

In the photosensitive resin composition according to the present invention, one or more epoxy resins (compounds) other than the epoxy resin represented by the formula (1), reactive epoxy monomers, and the like may be used concurrently as long as the weighted average epoxy equivalent of the epoxy resin (A) is in the range of 300 g/eq. or higher.

Examples of commercially available products of bisphenol F epoxy resins having an average value m in the formula (1) of less than 3 that can be used concurrently include YDF-8170C (m in the formula (1) is about 0 to about 0.1, epoxy equivalent: 155 to 165 g/eq.), commercially available from Nippon Steel & Sumikin Chemical Co., Ltd., jER806 (m in the formula (1) is 0 to about 0.1, epoxy equivalent: 160 to 170 g/eq.) and jER807 (m in the formula (1) is 0 to about 0.2, epoxy equivalent: 160 to 175 g/eq.), commercially available from Mitsubishi Chemical Corp., and EPICLON EXA830CRP (m in the formula (1) is 0 to about 0.1, epoxy equivalent: 155 to 163 g/eq.) and EPICLON EXA835LV (m in the formula (1) is 0 to about 0.1, epoxy equivalent: 160 to 170 g/eq.), commercially available from DIC Corp.

It is preferable that a bisphenol F epoxy resin having three or more epoxy groups in one molecule thereof represented by the above formula (3) is used concurrently in the photosensitive resin composition according to the present invention.

In the formula (3), a is an average value and denotes a real number in the range of 2 to 30. The "average value" referred to herein means an average repeating number.

The epoxy resin represented by the formula (3) can be obtained by glycidylating alcoholic hydroxyl groups of polycondensates of bisphenol F with epichlorohydrin by further using epichlorohydrin. The proportion of the alcoholic hydroxyl groups to be further glycidylated is not especially limited, but in consideration of the balance of various physical properties, the epoxy resin is preferably an epoxy resin in which about 50 to 80% of the alcoholic hydroxyl groups of the polycondensates of bisphenol F with epichlorohydrin is glycidylated.

Specific examples of commercially available products of the epoxy resin represented by the formula (3) include NER-7604 and NER-7403 (both are trade names, commercially available from Nippon Kayaku Co., Ltd.). The epoxy equivalent of the epoxy resin represented by the formula (3) is preferably 250 to 400 g/eq., and the softening point thereof is preferably 60 to 85° C.

Examples of the other epoxy resins (compounds) which may be used concurrently include Epikote 157 (trade name, bisphenol A novolac epoxy resin, commercially available from Mitsubishi Chemical Corp., epoxy equivalent: 180 to 250 g/eq., softening point: 80 to 90° C.), EPON SU-8 (trade name, bisphenol A novolac epoxy resin, commercially available from Momentive Performance Materials Inc., epoxy equivalent: 195 to 230 g/eq.), NC-3000 (trade name, biphenyl-phenol novolac epoxy resin, commercially available from Nippon Kayaku Co., Ltd., epoxy equivalent: 270 to 300 g/eq.), NER-1302 (trade name, bisphenol A epoxy resin in which a part of alcoholic hydroxyl groups is epoxidized, commercially available from Nippon Kayaku Co., Ltd., epoxy equivalent: 200 to 500 g/eq.), EOCN-1020 (trade name, commercially available from Nippon Kayaku Co., Ltd., epoxy equivalent: 190 to 210 g/eq.) and NC-6300H (trade name, commercially available from Nippon Kayaku Co., Ltd., epoxy equivalent: 230 to 235 g/eq.). According to one embodiment of the present invention, the epoxy resin contains no bisphenol A novolac epoxy resin.

Specific examples of the reactive epoxy monomers which may be used concurrently include diethylene glycol diglycidyl ether, hexanediol diglycidyl ether, dimethylolpropane diglycidyl ether, polypropylene glycol diglycidyl ether (commercially available from Adeka Corp., ED506), trimethylolpropane triglycidyl ether (commercially available from Adeka Corp., ED505), trimethylolpropane triglycidyl ether (low-chlorine type, commercially available from Nagase ChemteX Corp., EX321L), and pentaerythritol tetraglycidyl ether.

In the case of concurrently using epoxy resins other than the epoxy resin represented by the formula (1), the proportion of the epoxy resin represented by the formula (1) accounted for in the whole epoxy resin (A) is usually 20% by mass or higher, and preferably 35% by mass or higher.

The compound having phenolic hydroxyl groups (B) contained in the photosensitive resin composition according to the present invention comprises one or more phenol compounds selected from the group consisting of phenol compounds represented by the above formulae (2), (4), (5) and (6). Here, the "average value" meant by n, q, z or y in the formula (2), (4), (5) or (6) means an average repeating number.

Specific examples of the phenol compounds represented by the formula (2) include phenol novolacs and cresol novolacs; and phenol novolacs, since their photosensitive resin composition is excellent in coatability, are preferably used. As the phenol compound represented by the formula (2), those having a softening temperature of 50° C. or higher and 150° C. or lower are preferable, those having a softening temperature of 50° C. or higher and 100° C. or lower are more preferable, and those having a softening temperature of 70° C. or higher and 100° C. or lower are still more preferable. Specific examples of the phenol novolacs having a softening temperature of 50° C. or higher and 150° C. or lower include PN-152 (trade name, commercially available from Meiwa Plastic Industries Ltd., softening point: 50° C., hydroxyl equivalent: 105 g/eq.), H-1 (trade name, commercially available from Meiwa Plastic Industries Ltd., softening point: 80° C., hydroxyl equivalent: 104 g/eq.), TD-2131 (trade name, commercially available from DIC Corp., softening point: 80° C., hydroxyl equivalent: 105 g/eq.), and KA-1160 (trade name, commercially available from DIC Corp., softening point: 81° C., hydroxyl equivalent: 117 g/eq.). The hydroxyl equivalent of the phenol novolacs is, from the viewpoint of the compatibility with the epoxy resin (A) and the low moisture permeability of the cured product, preferably in the range of 80 to 200 g/eq., more preferably in the range of 80 to 130 g/eq., and still more preferably in the range of 100 to 120 g/eq.

For the compound having phenolic hydroxyl groups (B), a plurality of phenol compounds represented by the formula (2) may be used concurrently.

The phenol compound represented by the formula (4) includes bisphenol A novolacs. Specific examples thereof include VH-4150 (trade name, commercially available from DIC Corp., softening point: 85° C., hydroxyl equivalent: 118 g/eq.), VH-4170 (trade name, commercially available from DIC Corp., softening point: 103° C., hydroxyl equivalent: 118 g/eq.), and MEP-6309E (trade name, commercially available from Meiwa Plastic Industries Ltd., softening point: 81° C., hydroxyl equivalent: 116 g/eq.).

For the compound having phenolic hydroxyl groups (B), a plurality of phenol compounds represented by the formula (4) may be used concurrently.

The phenol compound represented by the formula (5) includes biphenyl phenol novolacs. Specific examples thereof include KAYAHARD GPH-65 (trade name, commercially available from Nippon Kayaku Co., Ltd., softening point: 65° C., hydroxyl equivalent: 200 g/eq.).

For the compound having phenolic hydroxyl groups (B) a plurality of phenol compounds represented by the formula (5) may be used concurrently.

The phenol compound represented by the formula (6) includes phenol aralkyl resins; and specific examples thereof include Milex XLC-3L (trade name, commercially available from Mitsui Chemicals Inc., softening point: 77° C., hydroxyl equivalent: 176 g/eq.).

For the compound having phenolic hydroxyl groups (B), a plurality of phenol compounds represented by the formula (6) may be used concurrently.

According to one preferable embodiment of the present invention, the compound having phenolic hydroxyl groups (B) comprises one or more phenolic compounds selected from the group consisting of phenol compounds represented by the formulae (2), (5) and (6).

With respect to the content of the compound having phenolic hydroxyl groups (B) in the photosensitive resin composition according to the present invention, the hydroxyl equivalent of the compound having phenolic hydroxide groups (B) is, with respect to 1 equivalent of an epoxy group of the epoxy resin (A), usually 0.1 to 0.9 equivalents, and preferably 0.2 to 0.5 equivalents. When the content of the compound having phenolic hydroxyl groups (B) is 0.9 equivalents or lower, the developability good in the photosensitized image pattern can be provided; and when the content is 0.1 equivalents or higher, the adhesiveness of the cured product with a substrate and the moisture resistance thereof can be maintained.

Here, in the case of concurrently using a plurality of the compounds having phenolic hydroxyl groups represented by the formulae (2), (4), (5) and (6), the proportion of use of each of the compounds having phenolic hydroxyl groups is not especially limited as long as the total amount of the plurality of the compounds contained in the phenol compound having phenolic hydroxyl groups (B) with respect to the mass of the epoxy resin (A) is in the above range.

In the photosensitive resin composition according to the present invention, a compound(s) having phenolic hydroxyl groups other than the phenol compounds represented by the formulae (2), (4), (5) or (6) may be used concurrently in the range not impairing the advantages of the present invention.

Examples of the compound having phenolic hydroxyl groups which may be used concurrently include the phenol compounds described as a raw material of the epoxy resin in the paragraph of the epoxy resins which may be used concurrently, but are not limited thereto.

The cationic photopolymerization initiator (C) contained in the photosensitive resin composition according to the present invention is a compound which generates a cation upon irradiation with radiation such as ultraviolet rays, far ultraviolet rays, laser light such as KrF and ArF, X-rays and electron beams, the cation being capable of acting as a polymerization initiator of the epoxy resin (A). The cationic photopolymerization initiator (C) includes onium complex salts. The onium complex salts typically include aromatic iodonium complex salts and aromatic sulfonium complex salts. Among them, specific examples of the aromatic iodonium complex salts include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, tolylcumyliodonium tetrakis(pentafluorophenyl)borate (commercially available from Rhodia Chemie, trade name: Rhodorsil PI2074), and di(4-tertiarybutyl)iodonium tris(trifluoromethanesulfonyl)methanide (commercially available from BASF, trade name: CGI BBI-C1).

Further, specific examples of the aromatic sulfonium complex salts include 4-thiophenyldiphenylsulfonium hexafluoroantimonate (commercially available from San-Apro Ltd., trade name: CPI-101A), thiophenyldiphenylsulfonium tris(pentafluoroethyl)trifluorophosphate (commercially available from San-Apro Ltd., trade name: CPI-210S), 4-{4-(2-chlorobenzoyl)phenylthio}phenylbis(4-fluorophenyl)sulfonium hexafluoroantimonate (commercially available from Adeka Corp., trade name: SP-172), a mixture of aromatic sulfonium hexafluoroantimonates containing 4-thiophenyldiphenylsulfonium hexafluoroantimonate (commercially available from Aceto Corp., USA, trade name: CPI-6976), triphenylsulfonium tris(trifluoromethanesulfonyl)methide (commercially available from BASF, trade name: CGI TPS-C1), tris[4-(4-acetylphenyl)sulfonylphenyl]sulfonium tris(trifluoromethylsulfonyl)methide (commercially available from BASF, trade name: GSID 26-1), and tris[4-(4-acetylphenyl)sulfonylphenyl]sulfonium tetrakis(2,3,4,5,6-pentafluorophenyl)borate (commercially available from BASF, trade name: Irgacure PAG290). Hexafluoroantimonate salts, although being inexpensive, since being liable to generate hydrogen fluoride by their decomposition, are suitable for applications not directly contacting with any metal. Methide salts and borate salts, since generating no hydrogen fluoride, can be suitably used in any applications including applications contacting with a metal. These can be used singly or in a combination of two or more thereof.

The content of the cationic photopolymerization initiator (C) in the photosensitive resin composition according to the present invention is, with respect to the solid content (i.e. the total amount of all components excluding solvents; hereinafter, the same meaning is applied) of the photosensitive resin composition according to the present invention, usually 0.3 to 15% by mass, and preferably 0.5 to 10% by mass.

The photosensitive resin composition according to the present invention may further comprise the epoxy group-containing silane compound (D). When the composition according to the present invention comprises the epoxy group-containing silane compound (D), there can be improved the adhesiveness with a substrate and the interlayer adhesiveness in the case where a multilayer structure is formed from the composition according to the present invention. Specific examples of the epoxy group-containing silane compound (D) include epoxy group-containing alkoxysilane compounds such as 3-glycidoxypropyltrimethoxysilane, 3-glycidoxypropylmethyldimethoxysilane, 3-glycidoxypropyltriethoxysilane, and 2-(3,4-epoxycyclohexyl)ethyltrimethoxysilane. These can be used singly or in a combination of two or more thereof.

The content of the epoxy group-containing silane compound (D) in the photosensitive resin composition according to the present invention is, with respect to the solid content of the photosensitive resin composition, usually 15% by mass or lower, and preferably 1 to 10% by mass.

The photosensitive resin composition according to the present invention can use the solvent (E) in order to reduce the viscosity of the photosensitive resin composition and improve the coatability. The solvent usable is not especially limited as long as being an organic solvent usually used for inks, coating materials and the like, being capable of dissolving each constituent of the photosensitive resin composition, and not causing a chemical reaction with the constituents. Specific examples of the solvent (E) include ketones such as acetone, ethyl methyl ketone, methyl isobutyl ketone and cyclopentanone, aromatic hydrocarbons such as toluene, xylene and methoxybenzene, glycol ethers such as dipropylene glycol dimethyl ether, dipropylene glycol diethyl ether and propylene glycol monomethyl ether, esters such as ethyl lactate, ethyl acetate, butyl acetate, methyl 3-methoxypropionate, carbitol acetate, propylene glycol monomethyl ether acetate and γ-butyrolactone, alcohols such as methanol and ethanol, aliphatic hydrocarbons such as octane and decane, and petroleum solvents such as petroleum ethers, petroleum naphthas, hydrogenated petroleum naphthas and solvent naphthas. These solvents can be used singly or as a mixture of two or more thereof.

The content of the solvent (E) in the photosensitive resin composition according to the present invention is, in the photosensitive resin composition containing the solvent, usually 95% by mass or lower, and preferably 10 to 90% by mass.

The photosensitive resin composition according to the present invention may further comprise a sensitizer in order to absorb ultraviolet rays, and give the absorbed light energy to the cationic photopolymerization initiator, particularly, to the aromatic iodonium complex salt. As the sensitizer, there are preferable, for example, thioxanthones and anthracene compounds having alkoxy groups at the 9-position and the 10-position thereof (9,10-dialkoxyanthracene derivatives). Examples of the alkoxy group include $C_1$ to $C_4$ alkoxy groups such as a methoxy group, an ethoxy group, a propoxy group and a butoxy group. The 9,10-dialkoxyanthracene derivatives may further have substituents. Examples of the substituents include halogen atoms such as a fluorine atom, a chlorine atom, a bromine atom and an iodine atom, $C_1$ to $C_4$ alkyl groups, alkyl sulfonate groups and alkyl carboxylate groups. Examples of the alkyl group in the alkyl sulfonate groups or alkyl carboxylate groups include $C_1$ to $C_4$ alkyl groups. The substitution position of these substituents is preferably the 2-position.

Specific examples of the thioxanthones include 2,4-dimethylthioxanthone, 2,4-diethylthioxanthone, 2-chlorothioxanthone, and 2,4-diisopropylthioxanthone. Among them, preferable are 2,4-diethylthioxanthone (commercially available from Nippon Kayaku Co., Ltd., trade name: Kayacure DETX-S), and 2-isopropylthioxanthone.

Examples of the 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonate methyl ester, 9,10-diethoxyanthracene-2-sulfonate methyl ester, and 9,10-dimethoxyanthracene-2-carboxylate methyl ester.

These sensitizers can be used singly or as a mixture of two or more thereof, but use of 2,4-diethylthioxanthone and 9,10-dimethoxy-2-ethylanthracene is most preferable. Since the sensitizer component exhibits the effect in a small amount thereof, the content of the sensitizer in the photosensitive resin composition according to the present invention is, with respect to the content of the cationic photopolymerization initiator (C), usually 30% by mass or lower, and preferably 20% by mass or lower.

To the photosensitive resin composition according to the present invention, an ion catcher may be added, as required, in the case where the adverse effects of ions originated from the cationic photopolymerization initiator (C) should be reduced. Specific examples of the ion catcher include alkoxyaluminums such as trismethoxyaluminum, trisethoxyaluminum, trisisopropoxyaluminum, isopropoxydiethoxyaluminum and trisbutoxyaluminum, phenoxyaluminums such as trisphenoxyaluminum and trisparamethylphenoxyaluminum, and organoaluminum compounds such as trisacetoxyaluminum, trisstearatoaluminum, trisbutylatoaluminum, trispropionatoaluminum, trisacetylacetonatoaluminum, tristrifluoroacetylacetonatoaluminum, trisethylacetoacetatoaluminum, diacetylacetonatodipivaloylmethanatoaluminum and diisopropoxy(ethylacetoacetato)aluminum. These components can be used singly or in a combination of two or more thereof. The content of the ion catcher is, with respect to the solid content of the photosensitive resin composition according to the present invention, usually 10% by mass or lower.

In the photosensitive resin composition according to the present invention, a various additive(s) such as thermoplastic resins, colorants, thickeners, defoaming agents and leveling agents can be used, as required. Examples of the thermoplastic resins include polyether sulfone, polystyrene and polycarbonate. Examples of the colorants include Phthalocyanine Blue, Phthalocyanine Green, Iodine Green, Crystal Violet, titanium oxide, carbon black, Naphthalene Black, Anthraquinone Red, Quinacridone Red, and Diketopyrrolopyrrole Red. Examples of the thickeners include Olben, Bentone and montmorillonite. Examples of the defoaming agents include silicone defoaming agents, fluoroalkyl defoaming agents, polymeric defoaming agents and other types. In the case of using these additives and the like, their contents are each, with respect to the solid content of the photosensitive resin composition according to the present invention, 10% by mass or lower as a sort of measure, but can suitably be increased or decreased according to the use purpose and the coating quality.

In the photosensitive resin composition according to the present invention, optional inorganic fillers such as barium sulfate, barium titanate, silicon oxide, amorphous silica, talc, clay, magnesium carbonate, calcium carbonate, aluminum oxide, aluminum hydroxide, montmorillonite and mica powder, and optional organic fillers such as polymethyl methacrylate, rubber, fluoropolymer and polyurethane powder can be used. The content of these inorganic and/or organic fillers is, with respect to the solid content of the photosensitive resin composition according to the present invention, 60% by mass or lower as a sort of measure, but can suitably be increased or decreased according to the use purpose and the function required for the cured film.

The photosensitive resin composition according to the present invention can be prepared by mixing and stirring, by a usual method, essential components of the epoxy resin (A), the compound having phenolic hydroxyl groups (B) and the cationic photopolymerization initiator (C), and as required, the epoxy group-containing silane coupling agent (D), the solvent (E) and the optional components such as the sensitizer, the ion catcher, the thermoplastic resin, the colorant, the thickener, the defoaming agent, the leveling agent and the inorganic fillers. In the mixing and stirring, there may be used, as required, a dispersing machine such as a dissolver, a homogenizer or a three-roll mill. Further after the mixing, filtration may be carried out by using a mesh, a membrane filter or the like.

The photosensitive resin composition according to the present invention can be used, for being coated on a substrate, preferably in a liquid form containing a solvent added therein. The photosensitive resin composition according to the present invention can be applied in a desired film thickness by controlling the rotating speed in a spin coat method comprising a step of dropping the photosensitive resin composition according to the present invention diluted to a desired viscosity with the solvent on the substrate, accelerating the substrate up to a certain rotating speed, and thereafter holding the rotating speed. Alternatively, the photosensitive resin composition can also be applied onto a substrate by another coating method such as roller coating, doctor knife coating, slot coating, dip coating, gravure coating or spray coating. After the coating, dry baking is carried out to evaporate the solvent. The dry baking conditions can be selected so as to form a semi-cured dry coating film of a photoresist. Typical conditions thereof involves bringing the substrate into contact or near contact with a hot plate having a smooth surface, and heating the substrate at 65° C. for 1 to 15 minutes, and then at 90 to 125° C. for 5 to 120 minutes depending on the thickness of the coating film, the volatility of the solvent, and the heat conductivity and the thickness of the substrate. Alternatively, the dry baking can be carried out in a convection-type oven. Then, a photosensitized image can be formed in the dried photosensitive resin composition layer by exposure using near ultraviolet rays or 300 to 500-nm bright lines from a medium or extra-high pressure mercury lamp through a photomask having a desired mask pattern drawn thereon, irradiation using energy rays of X-ray radiation from a synchrotron radiation source, or irradiation with electron beam radiation through direct or patterned exposure. In the mask exposure, contact, proximity or projection printing can be used. Following the exposure, in order to promote the polymerization reaction by an acid catalytic action in the exposed region on the photosensitive resin composition layer, post-exposure baking can be carried out. Typical conditions thereof involve baking on a hot plate at 65° C. for 1 to 5 minutes, and then at 95° C. for 1 to 60 minutes depending on the thickness of the coating film, and the heat conductivity and the thickness of the substrate.

Then, in order to dissolve and remove unexposed portions, the coating film is immersed typically in an organic solvent developing solution for 2 to 30 minutes depending on the thickness of the coating film and the solvent titer of the developing solution solvent. Further, the developed image is rinsed by applying a rinsing solvent thereby removing the developing solution adhered on the cured film. The adhered developing solution needs to be removed because of containing photoresist components dissolved therein and making scums on the photosensitized images when being dried thereby easily causing formation of stains. In the case of the dipping method, by preparing a clean developing solution tank and carrying out development on multistage, the adhesion of the scums is enabled to be prevented.

Alternatively, the developing solution solvent may be applied by spraying with the use of either an explosionproof spray nozzle for atomization or an explosionproof fine shower head spray nozzle. Further, other developing methods include a method of applying a developing solution by using a paddle method.

Examples of the developing solution include propylene glycol monomethyl ether acetate, γ-butyrolactone, acetone, cyclopentanone, diacetone alcohol, tetrahydrofurfuryl alcohol, N-methylpyrrolidone, anisole, and ethyl lactate, but is not limited thereto. Use of propylene glycol monomethyl ether acetate, which is good in the solubility of unexposed portions and is relatively inexpensive, is preferable.

Examples of the rinsing solution include the above developing solution solvents, and methanol, ethanol, isopropanol and n-butyl acetate. Among them, especially preferable are acetone, ethanol and isopropanol, which can be fast cleaned and speedily dried. Finally, the coating film can be subjected to a thermal treatment at 130 to 200° C. so as to cure the film with heat according to the heat resistance of the substrate thereby obtaining a permanent protecting film satisfying various properties.

Examples of the materials for the substrate usable for the photosensitive resin composition according to the present invention include, but not limited to, substrates having patterning regions of organic films, metals, semiconductors and insulating materials, such as silicon, silicon dioxide, silicon nitride, alumina, glass, glass-ceramics, gallium arsenide, indium phosphide, copper, aluminum, nickel, iron, steel, copper-silicon alloys, indium-tin oxide-coated glass, polyimide and polyester. Since the photosensitive resin composition according to the present invention is excellent in the adhesiveness with a substrate of Pt, LT, Au, Ta or the like, use of these metal substrates or substrates having such a metal layer on the surface is preferable.

The photosensitive resin composition according to the present invention can also be used as a resist laminate by being interposed between substrates. A resist laminate can be obtained, for example, by applying the photosensitive resin composition diluted with a solvent on a base film (i.e. a substrate) by using a roll coater, a die coater, a knife coater, a bar coater, a gravure coater or the like, and thereafter removing the solvent in a drying oven set at 45 to 100° C., and as required, further laminating a cover film (i.e. a substrate) or the like. At this time, the thickness of the resist on the base film can be regulated at 2 to 100 μm. As the base film or the cover film being a substrate, for example, a film such as polyester, polypropylene, polyethylene, TAC and polyimide can be used. As required, these films may be ones having been subjected to a release treatment with a silicone release treating agent, a non-silicone release treating agent or the like. When using such a resist laminate, for example, the following steps may be performed: the cover film is peeled off, and the photosensitive resin composition is transferred to a substrate at a temperature of 40 to 100° C. at a pressure of 0.05 to 2 MPa by a hand roller, a laminator or the like, and as in the above liquid photosensitive resin composition, subjected to exposure, post-exposure baking, development, and heat treatment.

If the photosensitive resin composition is used as a dry film resist by using the resist laminate according to the present invention, the steps of applying the composition to a support or substrate and drying it can be omitted, thus allowing the photosensitive resin composition according to the present invention to form fine patterns more simply.

In the case where the photosensitive resin composition according to the present invention is used as package components of MEMS devices, semiconductor devices and frequency filter devices, components for forming microreactors, and inkjet printing head components, the photosensitive resin composition is applied onto a substrate and dried thereby forming a photosensitive resin coating film as a first layer. The first layer is then subjected to exposure and post-exposure baking. Further, the photosensitive resin composition according to the present invention is applied thereto and dried thereby forming a photosensitive resin coating film as a second layer; and thereafter, the second layer is subjected to exposure and post-exposure baking. This step may be repeated a plurality of times; and finally, the resultant may be subjected to development and hard baking treatments altogether, by which a complex multilayer structure pattern can be formed. Alternatively, a multilayer structure pattern may be formed by developing a first layer and hard baking, which may be followed by applying and drying a second layer and subjecting to an alignment exposure through a photomask, and repeating development and hard baking. Alternatively, the formation of each photosensitive resin layer may be by lamination of a dry film resist.

Here, the term "package" refers to an encapsulating method or an encapsulated product to be used for blocking infiltration of outside gases and liquids in order to keep the stability of substrates, interconnects, elements and the like. Examples of the package referred to herein include packages having a driving part like MEMS, hollow packages for packaging a vibrator such as SAW devices, surface protection in order to prevent the degradation of semiconductor substrates, printed wiring boards, interconnects, components for forming microreactors, resin encapsulations in order to seal these components with a top plate, and the like. The term "wafer-level package" represents a manufacturing method in which the installation of a protecting film and terminals, interconnect processing and the packaging are carried out in the state of a wafer, and the wafer is then sliced into individual chips, or a manufacturing method in which fine micro- to nano-flow paths and an orifice plate for an inkjet nozzle are three-dimensionally processed altogether in a wafer.

The use of the photosensitive resin composition according to the present invention allows formation of patterns having a fine and vertical side wall shape by photolithography. Its cured product has properties excellent in low stress, small warping and resistance to moisture and heat. There can be provided a permanent resist and a cured product satisfying properties required for semiconductors and MEMS and micromachine application fields, particularly package components of MEMS devices, semiconductor devices and frequency filter devices, components for forming microreactors, and inkjet printing head components; and the permanent resist and the cured product are greatly useful in these fields.

EXAMPLES

Hereinafter, the present invention will be described in more detail by way of Examples, but these Examples are only illustrations to conveniently explain the present invention, and do not limit the scope of the present invention by any means.

Examples 1 to 10 and Comparative Examples 1 to 4

(Preparation of Photosensitive Resin Composition Solutions (Liquid Resists))

A mixture of epoxy resins (A), a compound having phenolic hydroxyl groups (B), a cationic photopolymerization initiator (C) and an epoxy group-containing silane compound (D) in the blend amounts (unit: part by mass, indicating masses of solid content alone excluding solvent) described in Table 1 was diluted with cyclopentanone so that the concentration became 65% by mass, and stirred, mixed and dissolved in a flask with a stirrer at 80° C. for 3 hours, allowed to cool, and thereafter subjected to filtration using a membrane filter of 1.0 μm in pore diameter, by which each of photosensitive resin composition solutions (liquid resists) according to the present invention and for comparison was obtained.

(Evaluations of the Sensitivity and the Resolution of the Photosensitive Resin Compositions)

Each of the liquid resists obtained in Examples 1 to 10 and Comparative Examples 1 to 4 was applied onto a silicon wafer by a spin coater, and thereafter pre-baked by a hot plate at 95° C. for 10 minutes thereby obtaining a photosensitive resin composition layer of 20 μm in dry film thickness after application. Thereafter, the photosensitive resin composition layer was cleared of edge beads and dried, and then irradiated with an exposure dose of 700 mJ/cm$^2$ (soft contact, i line) through a gray scale photomask for evaluation of resolution by using an i line exposure apparatus (mask aligner, commercially available from Ushio Inc.). Then, the irradiated photosensitive resin composition layer was post-exposure baked (hereinafter, referred to as "PEB") by a hot plate at 95° C. for 5 minutes. Then, the post-exposure baked photosensitive resin composition layer was immersed and developed in an SU-8 Developer (trade name, commercially available from MicroChem Corp., propylene glycol monomethyl ether acetate as a major component) at 23° C. for 3 minutes, and rinsed with 2-propanol and dried, by which a cured resin pattern on the silicon wafer was obtained. The exposure dose at which the mask transfer accuracy became best was defined as an optimum exposure dose, and the resolving size at this time was taken as a resolution, and the sensitivity and the resolution were evaluated. The results are shown in the following Table 1.

(Evaluation of the Internal Stress Value of the Cured Product of the Photosensitive Resin Composition)

The warping amounts of the substrate before and after the film formation of the silicon wafer (crystal orientation: 100, diameter: 100 mm, thickness: 0.5 mm) supported at three points were measured by using a stylus-type surface shape measuring device, and a value obtained by converting a change in the warping amounts before and after the film formation was taken as the internal stress. Generally since the stress of a film is not affected by the shape and material of a substrate on which the film is formed, a value obtained by forming a film on a silicon wafer and measuring warping amounts of the substrate before and after the film formation indicates an internal stress. In the case where a resin film shrinks by curing, the internal stress becomes a compression stress; and depending on the magnitude of the stress, the stress of the cured film increases the warping of the substrate, and even in the film itself, crazings and cracks are generated. A lower internal stress can reduce the warping of the substrate and eliminate the generation of cracks in the film itself.

Each liquid resist obtained in Examples 1 to 10 and Comparative Examples 1 to 4 was applied onto a silicon wafer by a spin coater, and pre-baked by a hot plate at 95° C. for 10 minutes thereby obtaining a photosensitive resin composition layer of 20 μm in dry film thickness after the application. Thereafter, the film surface on the wafer was entirely irradiated with the optimum exposure dose for the corresponding composition acquired in the above evaluation through a photomask which could conceal only the edge bead part of the peripheral part of the substrate. Then, the film was subjected to PEB on a hot plate at 95° C. for 5 minutes, immersed and developed in an SU-8 Developer at 23° C. for 3 minutes, rinsed with 2-propanol, dried and pre-hard baked on a hot plate at 120° C. for 30 minutes, thereafter hard baked in a convection oven at 200° C. for 60 minutes, and allowed to fully cool. The warping amount of each silicon wafer before the film formation and the warping amount thereof after the film formation of the resist of the corresponding composition were measured in a plurality of directions at the same position by a surface shape measuring apparatus, and the internal stress value was determined. The case where the internal stress value was lower than 10 MPa was represented as "○"; the case where being higher than 25 MPa, "x"; and the results are shown in Table 1.

(Evaluation of Tight Adhesion after Treatment with Moisture and Heat)

A silicon wafer having a Pt metal of 200 nm vapor-deposited thereon, an LT substrate, and a silicon wafer having Ta of 100 nm vapor-deposited thereon were prepared; each of the liquid resists obtained in Examples 1 to 10 and Comparative Examples 1 to 4 was applied onto each of these substrates as described above. The substrate having the liquid resist applied thereto was irradiated with the optimum exposure dose for the corresponding composition obtained in the above sensitivity evaluation test through a photomask provided with a test pattern for evaluation of tight adhesiveness. The process of hard baking after PEB was conducted in the same manner as in the process of the above stress evaluation test, by which a cured resin pattern was prepared on the silicon wafer. The wafers with the resin pattern were individually immersed and subjected to a test for moisture and heat in a PTFE closed vessel (relative humidity: 100%) filled with pure water at 85° C. for 24 hours. The adhesive force values of the resin pattern before and after the test were measured by a shear strength tester; and the case where no degradation in the adhesive force was observed was represented as "○", and the case where some degradation was observed was represented as "x", and the results are shown in Table 1.

TABLE 1

Compositions for Evaluation and Results of Evaluation of Photosensitive Resin Compositions

| | | Examples | | | | | | | | | | Comparative Examples | | | |
|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 |
| Epoxy resin (A) | (A-1) | 60.0 | 60.0 | 60.0 | 75.0 | 48.0 | 60.0 | 60.0 | 17.0 | 50.0 | 65.0 | | | | 10.0 |
| | (A-2) | | | | | | | | | 5.0 | | | | | |
| | (A-3) | 10.0 | 10.0 | 10.0 | 12.5 | 8.0 | 10.0 | 10.0 | 3.0 | 10.0 | | | | | |
| | (A-5) | 20.0 | 20.0 | 20.0 | | 19.0 | 20.0 | 20.0 | 20.0 | 8.0 | 20.0 | | | | |
| | (A-6) | | | | | | | | 45.0 | 7.0 | 5.0 | 20.0 | 50.0 | | |
| | (A-7) | | | | | | | | | | | 80.0 | | | 30.0 |
| | (A-8) | | | | | | | | | | | | | 30.0 | 50.0 |
| | (A-9) | | | | | | | | | | | | | 70.0 | |
| | (A-10) | | | | | | | | | | | | 50.0 | | |
| Compound having phenolic hydroxyl groups (B) | (B-1) | 10.0 | 10.0 | 10.0 | 12.5 | 25.0 | | | | | | | | | |
| | (B-2) | | | | | | 10.0 | | 15.0 | 20.0 | | 20.0 | | | |
| | (B-3) | | | | | | | 10.0 | | | | | | | 10.0 |
| | (B-4) | | | | | | | | | | 5.0 | | | | |
| Cationic photopolymerization initiator (C) | (C-1) | 1.0 | | | 1.0 | 1.0 | 1.0 | 1.0 | 1.0 | 1.0 | | | | | |
| | (C-2) | | 1.0 | | | | | | | | 1.0 | | 1.0 | | |
| | (C-3) | | | 4.0 | | | | | | | | 4.0 | | 4.0 | 4.0 |
| Epoxy group-containing silane compound (D) | (D) | 5.0 | 2.0 | 5.0 | 5.0 | 5.0 | 5.0 | 5.0 | 5.0 | 5.0 | 2.5 | 2.0 | 2.0 | 5.0 | 5.0 |
| Optimum exposure dose [mJ/cm$^2$] | | 450 | 450 | 450 | 450 | 450 | 450 | 450 | 300 | 400 | 400 | 350 | 550 | 200 | 500 |
| Resolution [μm] | | 6 | 6 | 6 | 15 | 8 | 8 | 8 | 8 | 8 | 8 | 9 | 7 | 60 | 25 |
| Weighted average WPE [g/eq.] | | 453 | 453 | 453 | 951 | 422 | 453 | 453 | 306 | 582 | 441 | 218 | 288 | 164 | 161 |

TABLE 1-continued

Compositions for Evaluation and Results of Evaluation of Photosensitive Resin Compositions

|  | Examples | | | | | | | | | | Comparative Examples | | | |
| --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 1 | 2 | 3 | 4 |
| Tight adhesiveness with moisture and heat *1 | | | | | | | | | | | | | | |
| on Pt | ○ | ○ | ○ | ○ | ○ | ○ | ○ | ○ | ○ | ○ | X | X | X | X |
| on LT | ○ | ○ | ○ | ○ | ○ | ○ | ○ | ○ | ○ | ○ | X | X | X | X |
| on Ta | ○ | ○ | ○ | ○ | ○ | ○ | ○ | ○ | ○ | ○ | X | X | X | X |
| Internal stress value [MPa] *2 | ○ | ○ | ○ | ○ | ○ | ○ | ○ | ○ | ○ | ○ | X | X | X | X |

*1: Before and after 85° C. × 100% RH × 24 hours treatment; ○: No degradation in adhesive force was observed; X: Some degradation in adhesive force was observed.
*2: Residual stress of cured product: ○: <10; and X: 25<

Compounds (A-1) to (D) listed in Table 1 are as follows, respectively. Further, the weighted average epoxy equivalent values were determined from parts by mass indicated in Table 1, epoxy equivalents described below, and blend ratios of components. The weighted average epoxy equivalent values are shown in one column in Table 1.
<Component (A): Epoxy Resins>
 (A-1) jER4004P (trade name, commercially available from Mitsubishi Chemical Corp., an epoxy resin having an average repeating number in the formula (1): m≈5.6, epoxy equivalent: 868 g/eq.)
 (A-2) jER4005P (trade name, commercially available from Mitsubishi Chemical Corp., an epoxy resin having an average repeating number in the formula (1): m≈7.0, epoxy equivalent: 1,046 g/eq.)
 (A-3) jER4007P (trade name, commercially available from Mitsubishi Chemical Corp., an epoxy resin having an average repeating number in the formula (1): m≈16.1, epoxy equivalent: 2,218 g/eq.)
 (A-5) YDF-8170C (trade name, commercially available from Nippon Steel & Sumikin Chemical Co., Ltd., epoxy equivalent: 160 g/eq.)
 (A-6) NER7604 (trade name, commercially available from Nippon Kayaku Co., Ltd., an epoxy resin represented by the formula (3), epoxy equivalent: 345 g/eq.)
 (A-7) EPON SU-8 (trade name, commercially available from Momentive Performance Materials Inc., epoxy equivalent: 200 g/eq.)
 (A-8) Celloxide 2021P (trade name, commercially available from Daicel Corp., epoxy equivalent: 126 g/eq.)
 (A-9) EP828 (trade name, commercially available from Mitsubishi Chemical Corp., epoxy equivalent: 189 g/eq.)
 (A-10) XD-1000 (trade name, commercially available from Nippon Kayaku Co., Ltd., epoxy equivalent: 248 g/eq.)
<Component (B): Compounds Having Phenolic Hydroxyl Groups>
 (B-1) PN-152 (trade name, commercially available from Meiwa Plastic Industries Ltd., a phenol compound represented by the formula (2), hydroxyl equivalent: 105 g/eq.)
 (B-2) H-1 (trade name, commercially available from Meiwa Plastic Industries Ltd., a phenol compound represented by the formula (2), hydroxyl equivalent: 104 g/eq.)
 (B-3) KAYAHARD GPH-65 (trade name, commercially available from Nippon Kayaku Co., Ltd., a phenol compound represented by the formula (5), hydroxyl equivalent: 200 g/eq.)
 (B-4) XL-225-3L (trade name, commercially available from Mitsui Chemicals Inc., a phenol compound represented by the formula (6), hydroxyl equivalent: 172 g/eq.)
<Component (C): Cationic Photopolymerization Initiators>
 (C-1) Irgacure PAG290 (trade name, commercially available from BASF)
 (C-2) GSID-26-1 (trade name, commercially available from BASF)
 (C-3) CPI-210S (trade name, commercially available from San-Apro Ltd.)
<Component (D): Epoxy Group-Containing Silane Compound>
 (D) 3-glycidoxypropyltrimethoxysilane As seen in the results in Table 1, it was found that properties of the compositions obtained in the Examples were as follows: the optimum exposure dose was small, and the sensitivity was high; the resolving size of sensitized patterns exhibited high resolution; the internal stress was low, and no cracks were generated in patterns; and the tight adhesiveness after the test for moisture and heat was kept.

Example 11

A Resist Laminate of the Photosensitive Resin Composition According to the Present Invention Further, ethylene glycol dimethyl ether was additionally blended to the compositional ratios of Example 1 in Table 1, and stirred and dissolved in a flask with a stirrer at 50° C. for 1 hour, and the mixture was diluted so that the solution viscosity at 25° C. became 2 Pa·s, allowed to cool, and thereafter subjected to a filtration using a membrane of 1.0 μm in pore diameter, by which a lacquer for dry film resist of a photosensitive resin composition according to the present invention was obtained. The lacquer was applied uniformly onto a base film (made of a propylene, commercially available from Mitsubishi Plastics, Inc., film thickness: 38 μm), and dried by a hot air convection drier at 65° C. for 5 minutes and then at 80° C. for 15 minutes. Thereafter, a cover film (made of a polypropylene, commercially available from Mitsubishi Plastics, Inc., film thickness: 38 μm) was laminated on the exposed surface thereby obtaining a resist laminate (i.e. a photosensitive resin composition laminate) in which the dry film resist having a thickness of 20 μm was interposed by the based film and the cover film.

(Patterning of the Dry Film Resist)

The cover film was peeled off from the photosensitive resin composition laminate obtained in the above; the resultant was laminated on a silicon wafer at a roll temperature of 70° C. at an air pressure of 0.2 MPa, and at a rate of 0.5 m/min; and thereafter, the base film was peeled off therefrom, by which a photosensitive resin composition layer (dry film resist) of 20 µm was obtained. The photosensitive resin composition layer was contact-exposed by using an i line exposure apparatus (mask aligner, commercially available from Ushio Inc.). Thereafter, the resultant was subjected to PEB by a hot plate at 95° C. for 5 minutes, and immersed and developed in an SU-8 Developer (trade name, commercially available from MicroChem Corp., propylene glycol monomethyl ether acetate as a major component) at 23° C. for 3 minutes, and rinsed with 2-propanol and dried, by which a cured resin pattern was obtained on the substrate. There was obtained at an optimum exposure dose of 450 J/cm² a cured product having no smears and no cracks, and having vertical side walls of 6 µm in thin-line adhesion pattern width. It was also confirmed that the tight adhesiveness with moisture and heat on each surface of Pt, LT, Ta had no degradation and was good. It was confirmed that the evaluation results of the internal stress were lower than 10 MPa, which were satisfactorily low.

INDUSTRIAL APPLICABILITY

The photosensitive resin composition according to the present invention allows patterns having a fine and vertical side wall shape to be formed by photolithography method. Its cured product has properties excellent in the resistance to moisture and heat and the high tight adhesiveness. There can be provided the permanent resist and the cured product provided with properties required by semiconductors and MEMS and micromachine application fields, particularly package components for MEMS devices, semiconductor devices and frequency filter devices, components for forming microreactors, and inkjet printing head components.

The invention claimed is:

1. A photosensitive resin composition comprising: an epoxy resin (A); a compound having phenolic hydroxyl groups (B); and a cationic photopolymerization initiator (C), wherein the epoxy resin (A) has a weighted average epoxy equivalent of 300 g/eq. or higher; and the epoxy resin (A) comprises 20% by mass or more of an epoxy resin represented by the following formula (1):

wherein m is an average value and denotes a real number in the range of 3 to 35, and having an epoxy equivalent of 500 to 4,500 g/eq.; and the compound having phenolic hydroxyl groups (B) comprises at least one or more phenol compounds selected from the group consisting of phenol compounds represented by the following formulae (2), (4), (5) and (6):

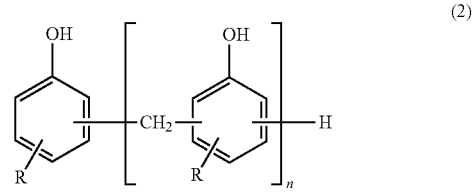

wherein n is an average value and denotes a real number in the range of 1 to 10; and each R independently denotes a hydrogen atom or an alkyl group having 1 to 4 carbon atoms,

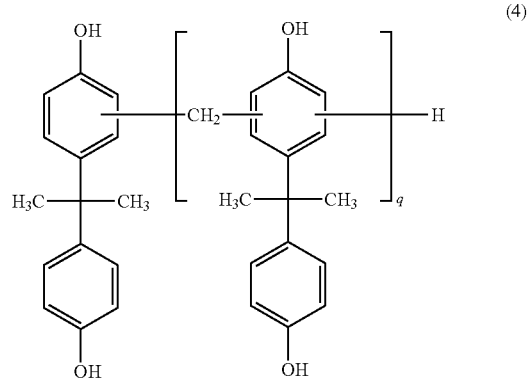

wherein q is an average value and denotes a real number in the range of 1 to 10,

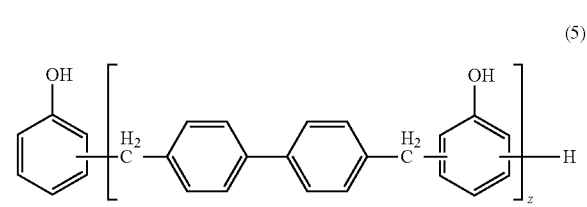

wherein z is an average value and denotes a real number in the range of 1 to 10, and

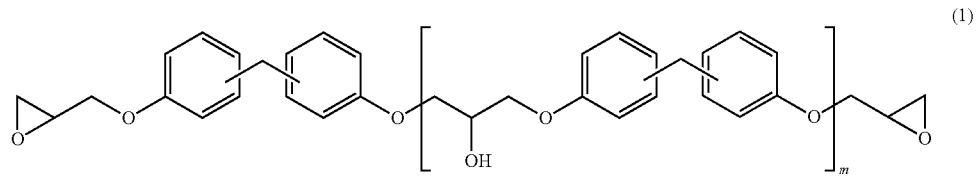

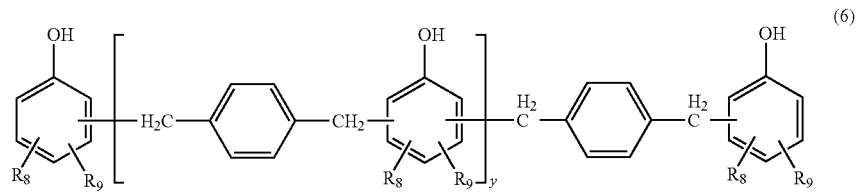

wherein y is an average value and denotes a real number in the range of 1 to 10; and $R_8$ and $R_9$ each independently denote a hydrogen atom or an alkyl group having 1 to 4 carbon atoms.

2. The photosensitive resin composition according to claim 1, wherein the epoxy resin (A) comprises an epoxy resin represented by the following formula (3):

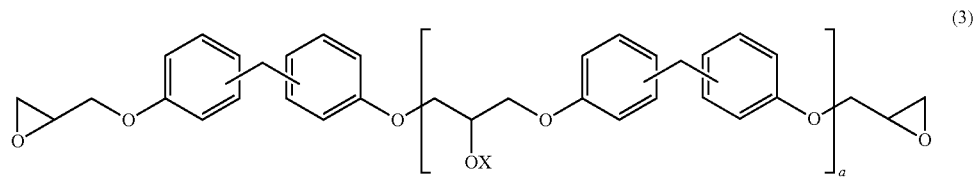

wherein a is an average value and denotes a real number in the range of 2 to 30; and each X independently denotes a hydrogen atom or a glycidyl group and at least one of the plurality of X is a glycidyl group.

3. The photosensitive resin composition according to claim 2, comprising 0.1 to 0.9 equivalents of the compound having phenolic hydroxyl groups (B) with respect to 1 equivalent of the epoxy resin (A).

4. The photosensitive resin composition according to claim 2, wherein the cationic photopolymerization initiator (C) is a cationic photopolymerization initiator of an onium complex salt.

5. The photosensitive resin composition according to claim 2, comprising an epoxy group-containing silane compound (D).

6. The photosensitive resin composition according to claim 2, comprising a solvent (E).

7. A cured product of the photosensitive resin composition according to claim 2.

8. A resist laminate, obtained by interposing the photosensitive resin composition according to claim 2 between substrates.

9. A cured product of a dry film resist obtained from the resist laminate according to claim 8.

10. The photosensitive resin composition according to claim 1, comprising 0.1 to 0.9 equivalents of the compound having phenolic hydroxyl groups (B) with respect to 1 equivalent of the epoxy resin (A).

11. The photosensitive resin composition according to claim 1, wherein the cationic photopolymerization initiator (C) is a cationic photopolymerization initiator of an onium complex salt.

12. The photosensitive resin composition according to claim 1, comprising an epoxy group-containing silane compound (D).

13. The photosensitive resin composition according to claim 1, comprising a solvent (E).

14. A cured product of the photosensitive resin composition according to claim 1.

15. A resist laminate, obtained by interposing the photosensitive resin composition according to claim 1 between substrates.

16. A cured product of a dry film resist obtained from the resist laminate according to claim 8.

* * * * *